US005621334A

United States Patent [19]

Urano et al.

[11] Patent Number: 5,621,334

[45] Date of Patent: Apr. 15, 1997

[54] METHOD AND APPARATUS FOR EVALUATING IMPURITIES IN A LIQUID CRYSTAL DEVICE

[75] Inventors: Taeko I. Urano, Kawasaki; Shigeru Machida, Tokyo; Kenji Sano, Tokyo; Hiroshi Yoshida, Tokyo, all of Japan

[73] Assignee: Kabushiki Kaisha Toshiba, Kawasaki, Japan

[21] Appl. No.: 535,337

[22] Filed: Sep. 28, 1995

[30] Foreign Application Priority Data

Sep. 30, 1994 [JP] Japan .................................... 6-236703
Mar. 24, 1995 [JP] Japan .................................... 7-065747

[51] Int. Cl.$^6$ .................................................... G01R 31/00

[52] U.S. Cl. ........................................ 324/770; 324/158.1

[58] Field of Search ............................... 324/158.1, 73.1, 324/765, 770, 719; 359/87, 83; 345/87, 904; 250/310, 311; 356/364, 367, 368, 400, 401

[56] References Cited

U.S. PATENT DOCUMENTS 4,820,977 4/1989 Brust ........................................ 324/751
4,887,031 12/1989 Brust ........................................ 324/751
5,268,638 12/1993 Brunner et al. .......................... 324/770
5,339,093 8/1994 Kumagai et al. ........................ 324/770

FOREIGN PATENT DOCUMENTS 2-290538 11/1990 Japan .

OTHER PUBLICATIONS

Koichi Iwata et al., Construction of a versatile microsecond time–resolved infrared spectrometer; Applied Spectroscopy, vol. 44, No. 9, 1990, pp. 1431–1437.

*Primary Examiner*—Vinh P. Nguyen
*Attorney, Agent, or Firm*—Oblon, Spivak, McClelland, Maier & Neustadt, P.C.

[57] ABSTRACT

A liquid crystal device evaluation method including the steps of irradiating infrared a liquid crystal device with light while applying an electric field to the liquid crystal device, and obtaining a field response curve corresponding to a change in infrared light intensity with time by measuring time-profile of infrared light intensity having passed through the liquid crystal layer, wherein an impurity mixed in the liquid crystal device is detected on the basis of the slope of the field response curve which is obtained, when pulsed electric fields having different polarities are applied to the liquid crystal device, within a time corresponding to the pulse width of each pulsed electric field. An apparatus for realizing the evaluation method is also disclosed.

24 Claims, 5 Drawing Sheets

METHOD AND APPARATUS FOR EVALUATING IMPURITIES IN A LIQUID CRYSTAL DEVICE

BACKGROUND OF THE INVENTION

1. Field of the Invention

The present invention relates to a liquid crystal device evaluation method and apparatus and, more particularly, to a method and apparatus for detecting impurities mixed in a liquid crystal device.

2. Description of the Related Art

In a liquid crystal device, if impurities which respond to electric fields (to be referred to as field responsive impurities hereinafter) are mixed in, e.g., a liquid crystal, the device performance such as response speed and contrast deteriorates, and the service life shortens. Field responsive impurities are chemical species which move in a device or have power of transporting electric charges upon application of an electric field. The field responsive impurities include protons, organic ions, inorganic ions, compounds having hydrogen bonding capability, compounds having electron transport ability, compounds having large dipole moments, compounds having large polarizabilities, and the like. Therefore, it is indispensable to detect, identify, and determine field responsive impurities mixed in a device and to improve the manufacturing process so as to prevent them from being mixed.

Conventionally, for this impurity evaluation a method of measuring the voltage retention ratio of a liquid crystal device at high temperatures is used. This method allows evaluation of a device in its final state. The method, however, requires much time and labor. In addition, no impurities are identified. For these reasons, it takes time to specify causative materials for impurities and a process in which impurities are mixed in the liquid crystal device.

Furthermore, field responsive impurities originate from both a liquid crystal alignment film and a liquid crystal material. For this reason, evaluation of impurities has been performed for the respective cases. For example, with respect to a liquid crystal alignment film made of a polyimide which is formed using polyamic acid as an alignment film material, the imidization ratio in a film formation process is determined by infrared absorption measurement, or impurities are detected using a change in the anisotropy of infrared absorption of a film. Since these methods use infrared absorption measurement of a liquid crystal alignment film, it takes time to perform the measurement, and the measurement sensitivity is not high enough.

SUMMARY OF THE INVENTION

It is an object of the present invention to provide a liquid crystal device evaluation method which can easily detect, identify, and determine field responsive impurities contained in a liquid crystal device with high sensitivity, and an apparatus for realizing the evaluation method.

According to the present invention, there is provided a liquid crystal device evaluation method comprising the steps of irradiating a liquid crystal device having a liquid crystal layer between a pair of electrodes with light while applying an electric field to the liquid crystal device, and obtaining a field response curve corresponding to a change in light intensity with time by measuring light intensity having passed through the liquid crystal layer as the function of time, wherein an impurity mixed in the liquid crystal device is detected on the basis of a slope of the field response curve which is obtained, when pulsed electric fields having different polarities are applied to the liquid crystal device, within a time corresponding to a pulse width of each pulsed electric field.

According to the present invention, there is provided a liquid crystal device evaluation apparatus comprising means for applying an AC pulsed electric field whose polarity is reversed with time to a liquid crystal device having a liquid crystal layer between a pair of electrodes, a light source for irradiating the liquid crystal layer with light, a spectroscopic means for extracting light in a specific wavelength range from the light irradiated from the light source, a photodetector for converting the light in the specific wavelength range, which has been irradiated from the light source and passed through the liquid crystal layer, into an electric signal, means for analyzing the electric signal obtained by the photodetector as the function of time, and extracting a signal obtained by integrating the analyzed signals, and signal analyzing means for calculating a slope of a field response curve representing a change in the obtained integrated signal with time.

According to the present invention, there is provided another liquid crystal device evaluation apparatus comprising a power supply for applying an AC pulsed electric field whose polarity is reversed with time to a liquid crystal device having a liquid crystal layer between a pair of electrodes, and an infrared spectrometer for obtaining a field response curve of the liquid crystal device, to which the AC pulsed electric field is applied, by a time-resolved infrared spectroscopic method, the infrared spectrometer having a signal analyzer for calculating a slope of the field response curve.

DETAILED DESCRIPTION OF THE PREFERRED EMBODIMENTS

Figure 1:
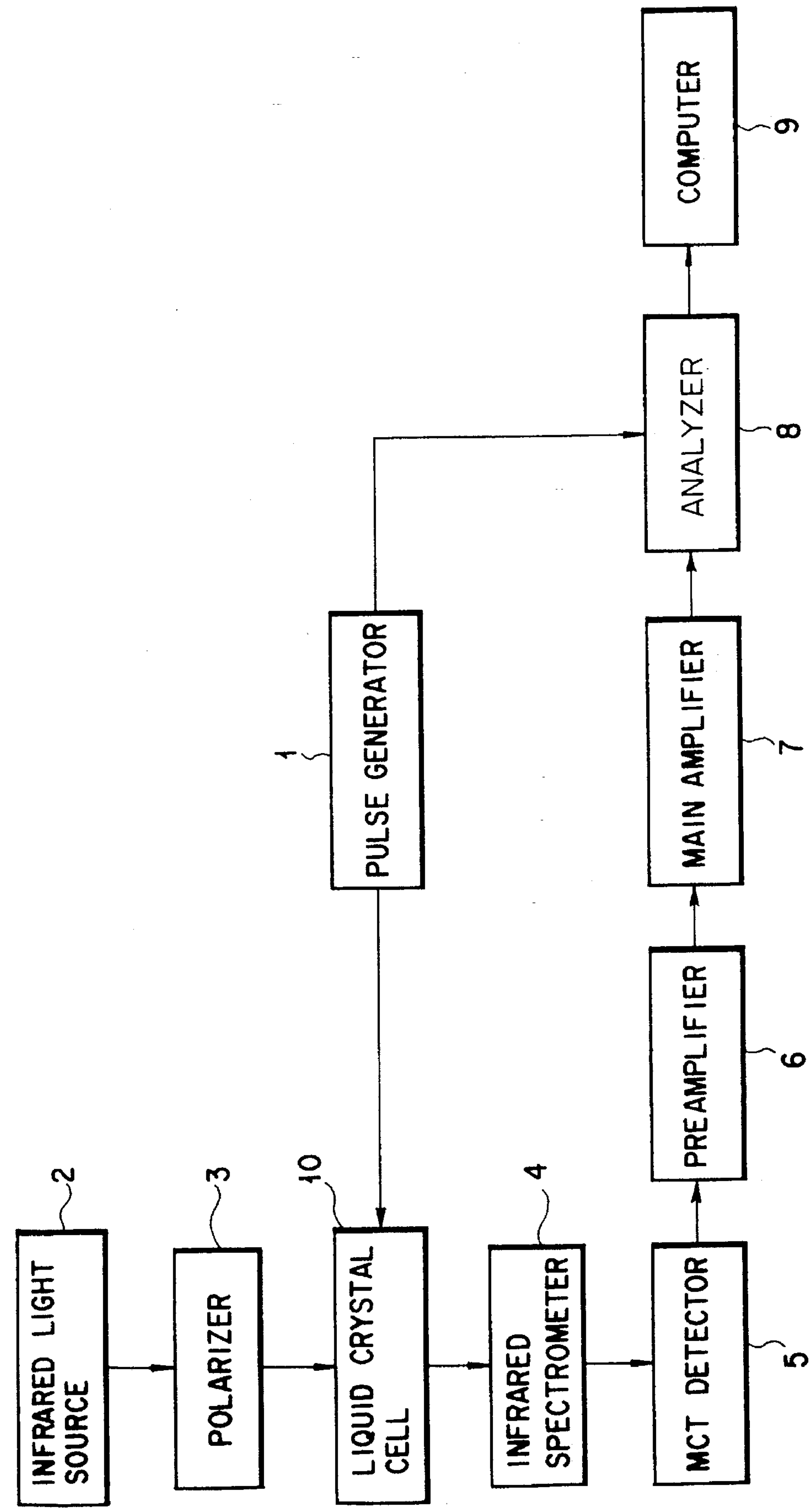
FIG. 1 is a block diagram showing a liquid crystal device evaluation apparatus of the present invention.

The principle of the present invention will be briefly described first. Pulsed electric fields having different polarities, more specifically AC pulsed electric fields, are applied to a liquid crystal device having a liquid crystal layer between a pair of electrodes to induce motions of liquid crystal molecules. In this state, the liquid crystal device is irradiated with appropriate light, e.g., infrared light, and the intensity of light in a specific wavelength range, which has passed through the liquid crystal layer, is detected. Changes in this intensity are then measured as the function of time. From this measurement result, field response curves are obtained. These curves correspond to changes in light intensity with time, which occur when pulsed electric fields having different polarities are applied to the liquid crystal device. The obtained field response curves change depending on whether a field responsive impurity is contained in the liquid crystal. More specifically, the slope of each field response curve variously changes within the time of the pulse width of an AC pulsed electric field applied to the liquid crystal device. This is because the effective electric field applied to liquid crystal molecules decreases owing to the influence of impurities mixed in the liquid crystal. The manner of this change in the slope of the field response curve differs depending on the amount and type of impurities. In addition, if the impurity amount exceeds a certain value, this manner of change differs depending on the polarity of an electric field to be applied. Therefore, the impurity mixed in the liquid crystal can be detected, identified, and determined by analyzing the slope of each field response curve obtained upon application of the pulsed electric fields having different polarities.

As light used in the present invention, infrared light is especially preferable, as described above, because a field response curve can be obtained with high sensitivity. In order to detect light in a specific wavelength range, for example, light may be dispersed using an arbitrary spectroscopic means (spectrometer). Light to be detected may be either light transmitted through the liquid crystal device or light reflected by the device.

The waveform of an AC pulsed electric field used in the present invention is not specifically limited. For example, a rectangular wave, a triangular wave, a sine wave, or a combined wave thereof may be used. The pulse width in the present invention means a time T corresponding to ½ the period of a fundamental wave constituting an AC pulsed electric field regardless of whether the fundamental wave is a rectangular, triangular, or sine wave, i.e., the minimum time required to apply an electric field having one polarity to the liquid crystal device for each fundamental wave constituting an AC pulsed electric field.

The above manner of change in the slope of a field response curve differs depending on the pulse width of an AC pulsed electric field to be applied. In addition, the manner of change which is dependent on the pulse width is unique to each impurity. More specifically, when an electric field is applied to the liquid crystal device, a field responsive impurity in the liquid crystal moves or it transports an electric charge in response to the electric field. When the polarity of the electric field is reversed, the direction of the force acting on the field responsive impurity or the charge is reversed. As a result, the impurity or the charge moves in the opposite direction to the above direction. If, however, the pulse width decreases below a certain value, the reversal of the movement of the impurity or the charge cannot follow the reversal of the polarity of the electric field. As a result, the evaluation of the impurity using a field response curve cannot be performed. As described above, since the pulse widths with which impurities cannot be detected differ depending on the effective mass and electric characteristics of each impurity or charge. These pulse widths therefore can be associated with the types of impurities. That is, an impurity mixed in the liquid crystal device can be specified by observing a field response curve while changing the pulse width of an AC pulsed electric field.

Furthermore, specific impurities mixed in the liquid crystal device can be detected by applying a combined AC pulsed electric field obtained by combining pulse sequences having different pulse widths, and observing a field response curve corresponding to each pulse sequence constituting the combined AC pulsed electric field.

A liquid crystal device evaluation apparatus for realizing the method of the present invention will be described below. An example of this evaluation apparatus includes a means for applying an AC pulsed electric field, whose polarity is reversed with time, to a liquid crystal device having a liquid crystal layer between a pair of electrodes, a light source for irradiating the liquid crystal layer with light, e.g., an infrared light source, a spectroscopic means for extracting light in a specific wavelength range from the light irradiated from the light source, a photodetector, e.g., an infrared detector, which converts the light in the specific wavelength range, which has been irradiated from the light source and passed through the liquid crystal layer, into an electric signal, a means for analyzing the electric signal obtained by the photodetector as the function of time, and extracting a signal obtained by integrating the analyzed signals, and a signal analyzing means for calculating the slope of a field response curve which indicates a change in the integrated signal with time.

In order to extract light in a specific wavelength range, the evaluation apparatus of the present invention uses an arbitrary spectrometer (dispersive device) such as a grating, a prism, or an interference filter. This spectrometer may be disposed between the liquid crystal device and the photodetector to obtain light in a specific wavelength range by dispersing light which has passed through the liquid crystal layer. Alternatively, the spectrometer may be disposed between the light source and the liquid crystal device to obtain light in a specific wavelength range by dispersing light from the light source and then to irradiate the liquid crystal device with the light having the specific wavelength. If the spectrometer is disposed in the latter manner, unnecessary light outside a specific wavelength range for measurement is not irradiated on the liquid crystal device. For this reason, an increase in the temperature of the liquid crystal device can be suppressed, and the conditions suitable for field response curve measurement can be maintained.

As the infrared detector, for example, a high-sensitivity MCT (mercury-cadmium-telluride) detector is used. As the means for analyzing an electric signal obtained by the infrared detector as the function of time, and extracting a signal obtained by integrating the analyzed signals, a boxcar integrator or a digital oscilloscope is used. When infrared light is used as light to be measured, since infrared light to be detected is weak, an electric signal obtained by the infrared detector is generally amplified by an amplifier.

According to the evaluation apparatus of the present invention, measurement can be performed at positions in the liquid crystal device by adjusting the size of an incident beam spot on the liquid crystal device as a sample.

As described above, in order to identify impurities mixed in the liquid crystal device, the means for applying an AC pulsed electric field may apply a combined AC pulsed electric field obtained by combining pulse sequences having different pulse widths, and the analyzing and extracting means may analyze an electric signal obtained by the infrared detector by discriminating electric signal component corresponding to the respective pulse sequence from the obtained electric signal, and extract a signal obtained by analyzing as the function of time and integrating each of the obtained electric signal components.

The liquid crystal device evaluation apparatus of the present invention will be described in more detail below with reference to the accompanying drawings.

FIG. 1 is a block diagram showing an example of the evaluation apparatus. Referring to FIG. 1, a pulse signal generated by a synthesizer or a pulse generator 1 is applied to a liquid crystal cell 10. Meanwhile, the liquid crystal cell 10 is irradiated with infrared light emitted from an infrared light source 2 and passed through a polarizer 3. An infrared spectrometer 4 extracts infrared light of a desired wavelength transmitted through the liquid crystal cell 10. An MCT detector 5 detects the infrared light and converts it into an electric signal. This electric signal is amplified by a preamplifier 6 and a main amplifier 7. The amplified signal is then fed to a digital sampling oscilloscope 8 to be integrated as the function of time. The overall evaluation apparatus is controlled by a computer 9.

Note that the polarizer 3 may be omitted. In addition, a combined AC pulsed electric field may be generated by combining pulse sequences having different pulse widths, and an electric signal obtained by the infrared spectrometer 4 may be analyzed into electric signals corresponding to the respective pulse sequences constituting the combined AC pulsed electric field. In this case as well, the apparatus is controlled by the computer 9.

Figure 2:
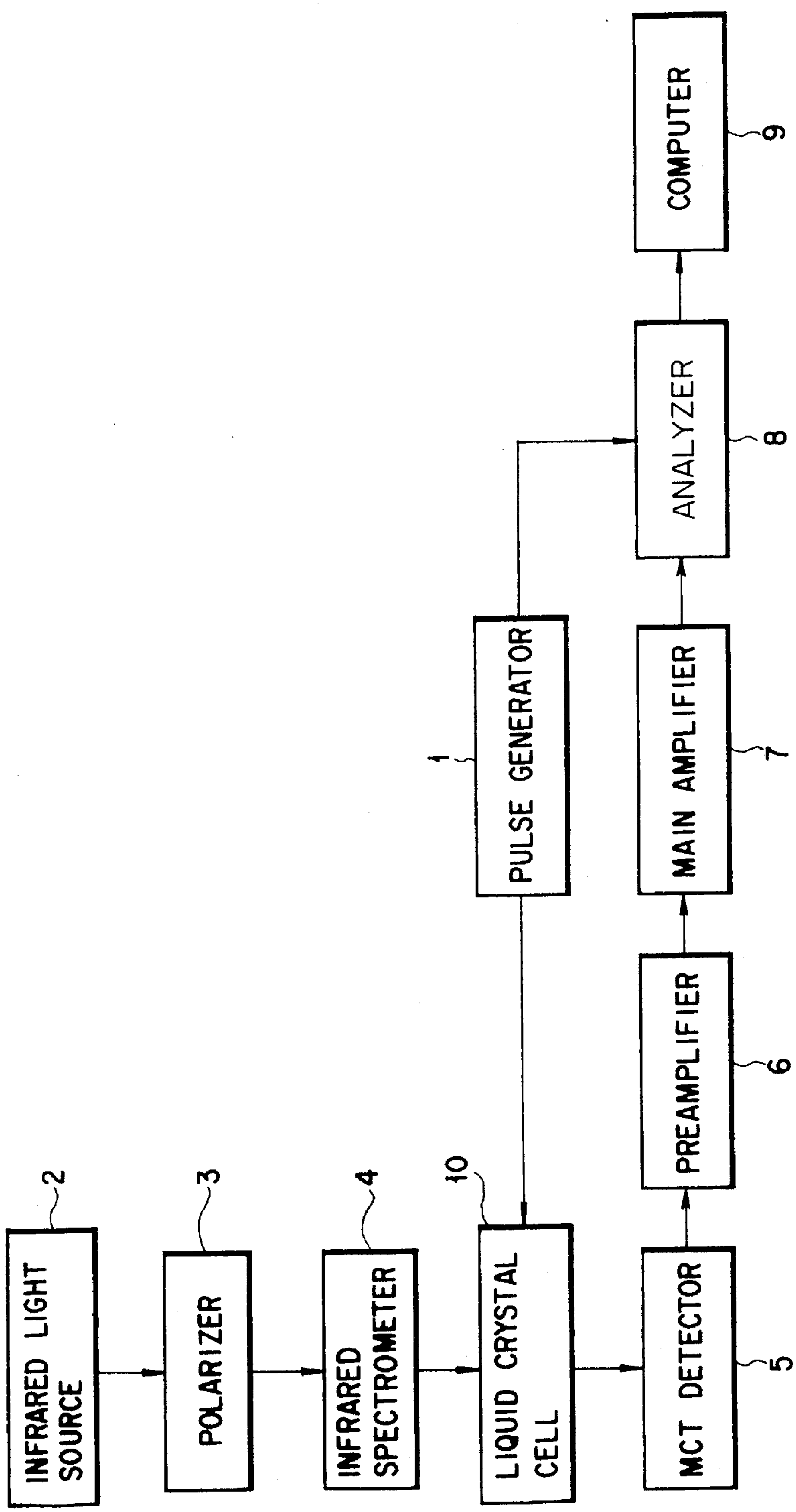
FIG. 2 is a block diagram showing another liquid crystal device evaluation apparatus of the present invention.

FIG. 2 is a block diagram showing another example of the evaluation apparatus. The arrangement of the evaluation apparatus in FIG. 2 is almost the same as that in FIG. 1 except that an infrared spectrometer 4 is disposed between an infrared light source 2 and a liquid crystal cell 10.

According to the arrangement in FIG. 2, unnecessary light outside the wavelength range for measurement can be removed by the infrared spectrometer 4. For this reason, an increase in the temperature of the liquid crystal cell 10 can be suppressed, and the conditions suitable for field response curve measurement can be maintained.

In addition, the liquid crystal device evaluation apparatus of the present invention may include a power supply for applying an AC pulsed electric field, whose polarity is reversed with time, to a liquid crystal device having a liquid crystal layer between a pair of electrodes, and an infrared spectrometer for obtaining a field response curve of the liquid crystal device, to which the AC pulsed electric field is applied, by a time-resolved infrared spectroscopic method, and the infrared spectrometer may have a signal analyzer for calculating the slope of the field response curve.

That is, the evaluation apparatus comprises an infrared spectrometer incorporating an infrared light source, a spectrometer for extracting infrared light in a specific wavelength range from light irradiated from the infrared light source, an infrared detector for converting the infrared light in the specific wavelength range, which has been irradiated from the infrared light source and passed through the liquid crystal layer, into an electric signal, an integrator for analyzing the electric signal obtained by the infrared detector as the function of time, and obtaining a signal by integrating the analyzed signals, and a signal analyzer for calculating the slope of a field response curve which indicates a change in the integrated signal with time.

EXAMPLES

Examples of the present invention will be described below.

In the following examples, a liquid crystal cell into which pentylcyanobiphenyl (5CB) represented by the chemical formula below was injected as a liquid crystal material was used, and measurement was performed on the basis of the CN triple bond of the cyano group of 5CB. Since the transition dipole moment of this triple bond stretching vibration is parallel to the long axis of a liquid crystal molecule, the direction of the liquid crystal molecule upon application of an electric field can be evaluated by detecting 2225-$cm^{-1}$ infrared absorption assigned to this mode.

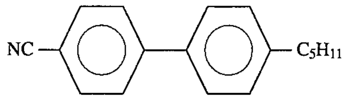

EXAMPLE 1

As a substrate, a silicon wafer or a glass substrate having an ITO (indium-tin oxide) transparent electrode is used. A polyamic acid solution (LX-1400 available from Hitachi Chemical Co., Ltd.) as a polyimide precursor, an alignment film material for a TN type liquid crystal device, is coated onto the substrate by spin coating. The resultant membrane is baked in an oven at 250° C. or 350° C. for one hour to form a liquid crystal alignment film. After a rubbing treatment, a liquid crystal cell with a cell gap of about 10 μm is manufactured using such substrates. As a liquid crystal material, 5CB is injected into this liquid crystal cell. The polyamic acid used as an alignment film material is imidized into a polyimide in the baking process. If, however, the polyamic acid is not sufficiently imidized into a polyimide, and unreacted polyamic acid is left, it is considered that a field responsive impurity originating from this acid, e.g., protons, is present in the cell.

As a reference sample, a liquid crystal cell is manufactured using an alignment film material for a TFT liquid crystal device made of a polyimide solution which has been imidized in advance. In the reference sample, since the alignment film material has been imidized in advance, it is expected that no field responsive impurity originating from polyamic acid is present in the cell.

Figure 3:
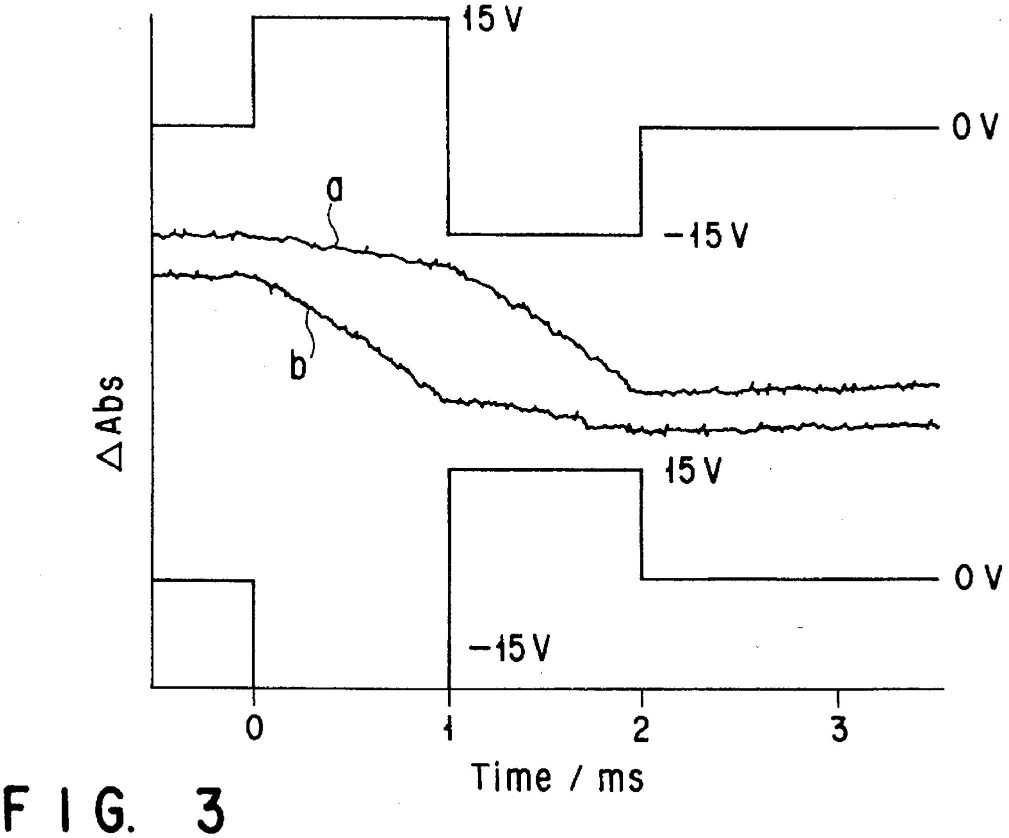
FIG. 3 is a graph showing the field response curves of sample 1 in Example 1 of the present invention.
Figure 4:
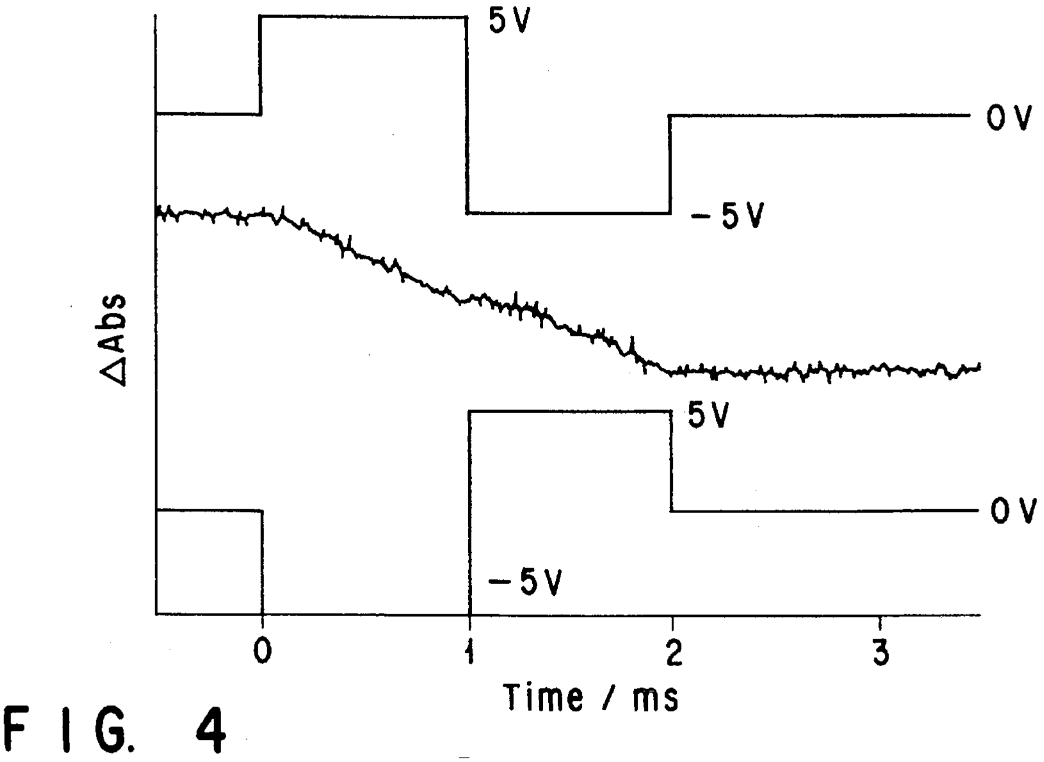
FIG. 4 is a graph showing the field response curve of sample 2 in Example 1 of the present invention.
Figure 5:
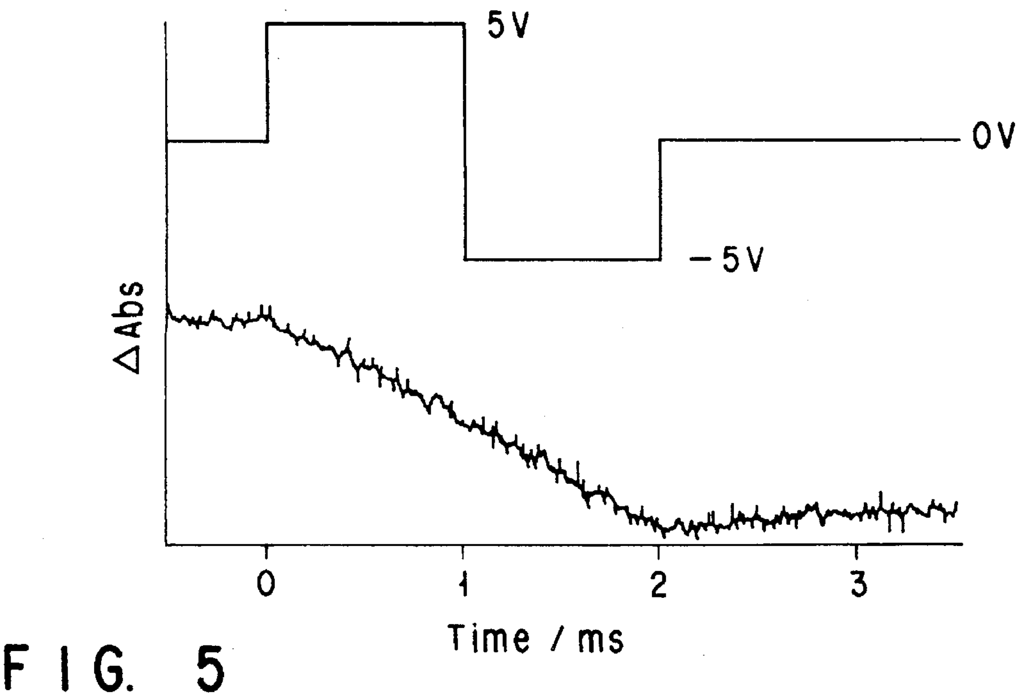
FIG. 5 is a graph showing the field response curve of a reference sample in Example 1 of the present invention.

AC pulsed electric fields are respectively applied to these liquid crystal cells, and the resultant field response curves are measured using the evaluation apparatus in FIG. 1. FIG. 3 shows the measurement result for the sample baked at 250° C. (sample 1). FIG. 4 shows the measurement result for the sample baked at 350° C. (sample 1). FIG. 5 shows the measurement result for the reference sample.

In the case of sample 1 (baked at 250° C.) in FIG. 3, the slope of a field response curve greatly changed within the pulse width before and after the polarity of the electric field is reversed. In addition, two field response curves whose slopes changed in different manners depending on whether the polarity of the first applied pulse is positive or negative are observed. More specifically, when the polarity of the first applied pulse is positive, the slope of the field response curve is small before the polarity of the electric field is reversed and becomes large after the polarity reversal, as indicated by "a" in FIG. 3. In contrast to this, when the polarity of the first applied pulse is negative, the slope of the field response curve is large before the polarity of the electric field is reversed and becomes small after the polarity reversal, as indicated by "b" in FIG. 3.

In the case of sample 2 (baked at 350° C.) in FIG. 4, although the slope of the field response curve changed within the pulse width before and after the polarity of the electric field is reversed, the change is more gradual than that in the case shown in FIG. 3. In addition, no differences in field response curves are observed irrespective of the polarity of the first applied pulsed electric field.

In the case of the reference sample in FIG. 5, the slope of the field response curve remains constant within the pulse width before and after the polarity of electric field is reversed.

The differences among the cases in FIGS. 3, 4 and 5 can be interpreted as follows. In the reference sample, since no field responsive impurity originating from the polyamic acid is present in the cell, the sample is free from the influence of the impurity. In sample 2, although the imidization is almost complete, a small amount of field responsive impurity originating from the polyamic acid is present. For this reason, the slope of the field response curve slightly changes owing to the difference in polarity between the pulsed electric fields to be applied. In contrast to this, in sample 1, the imidization is incomplete, and some unreacted polyamic acid is left. For this reason, the field response curve greatly changes. The causes for this great change are explained as follows. Since part of the electric field is consumed by the field responsive impurity (e.g., protons), the effective electric field applied to liquid crystal molecules weakens. In addition, since the upper and lower alignment films are not perfectly identical but asymmetric in terms of substrate surface area, film thickness, imidization ratio, and the like, the states of electric double layers on the alignment film surfaces and the manner of the movement of the impurity in the liquid crystal cell differ, upon application of an electric field, depending on the polarity of the electric field.

EXAMPLE 2

As a substrate, a silicon wafer or a glass substrate having an ITO transparent electrode is used. An alignment film material made of a polyimide solution for a TFT liquid crystal device, which has been imidized in advance, is coated onto the substrate by spin coating. The resultant membrane is baked in an oven at 180° C. for one hour to form a liquid crystal alignment film. After a rubbing treatment, a liquid crystal cell with a cell gap of about 10 μm is manufactured. A liquid crystal material in which 2.5 mg of ethanol is mixed as a field responsive impurity in 3 g of 5CB is injected into the liquid crystal cell. In this case, the molar ratio of 5CB:ethanol is 1000:3.5.

Figure 6:
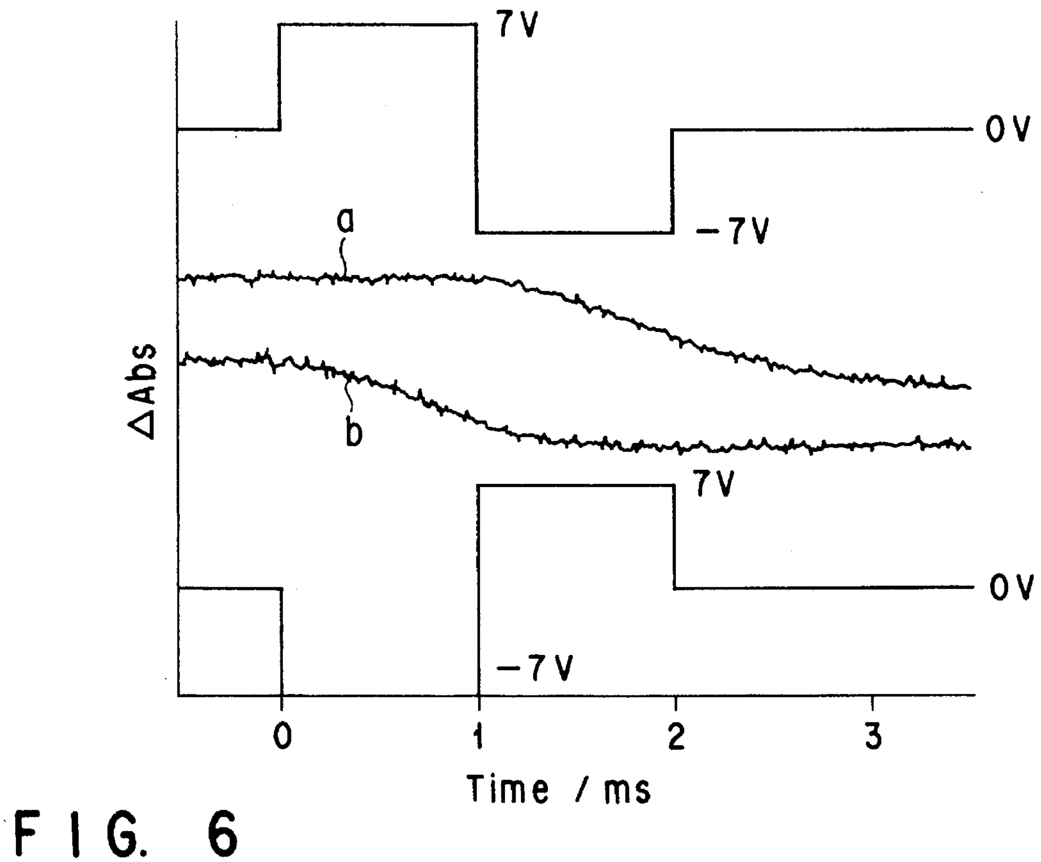
FIG. 6 is a graph showing the field response curves of sample 3 in Example 2 of the present invention.

FIG. 6 shows the result obtained by measuring field response curves using the evaluation apparatus in FIG. 1 when an AC pulsed electric field is applied to sample 3. Similar to the case in FIG. 3, in the case in FIG. 6, the slope of the field response curve greatly changed in the pulse width before and after the polarity of the electric field is reversed. In addition, two field response curves a and b, whose slopes changed in different manners depending on whether the polarity of the first applied pulse is positive or negative, are observed. It is ascribed that this great change in field response curve due to the difference in polarity between pulsed electric fields to be applied is caused by the ethanol or water contained in the ethanol mixed in the liquid crystal. That is, the ethanol or the water is considered to produce protons to serve as a field responsive impurity. If, therefore, ethanol is contained in the liquid crystal at a molar ratio of 1000:3.5 or more, the ethanol can be detected as a field responsive impurity.

In addition, if a calibration curve is prepared in advance by changing the ethanol concentration in the liquid crystal, the amount of ethanol mixed in the liquid crystal can be determined. As is apparent, this method can also be applied to other impurities. In addition, according to the present invention, if the computer 9 of the liquid crystal device evaluation apparatus includes a signal analyzing means for calculating the slope of a field response curve, a field responsive impurity can be automatically and accurately detected by the liquid crystal device evaluation apparatus.

EXAMPLE 3

The liquid crystal cell manufactured by baking at 350° C. in the process of forming the liquid crystal alignment film in Example 1 is used. A field response curve is measured using the evaluation apparatus in FIG. 1 in the same manner as described above while a pulse width T of an AC pulsed electric field is sequentially decreased into halves as follows:

T=1 ms, T=0.5 ms, T=0.25 ms, . . .

As a result, in the range in which the pulse width T exceeds 125 μs, the slope of the field response curve changes upon polarity reversal of the AC pulsed electric field, and a discontinuity of the time change rate of the field response curve is observed. In contrast to this, in the range in which the pulse width T is 125 μs or less, even when the polarity of the AC pulsed electric field is reversed, the differential coefficient of the field response curve is continuous. As described above, it is confirmed that in the range in which the pulse width T exceeds 125 μs, protons originating from the polyamic acid as a liquid crystal alignment film material are detected as an impurity.

EXAMPLE 4

The liquid crystal cell in the Example 2 is used. A field response curve is measured using the evaluation apparatus in FIG. 1 in the same manner as described above while a pulse width T of an AC pulsed electric field is sequentially decreased into halves as follows:

T=1 ms, T=0.5 ms, T=0.25 ms, . . .

As a result, in the range in which the pulse width T exceeds 62.5 μs, the slope of the field response curve changes upon polarity reversal of the AC pulsed electric field, and a discontinuity of the differential coefficient of the field response curve is observed. In contrast to this, in the range in which the pulse width T is 62.5 μs or less, even when the polarity of the AC pulsed electric field is reversed, the differential coefficient of the field response curve is continuous. As described above, it is confirmed that in the range in which the pulse width T exceeds 62.5 μs, protons originating from ethanol as a cleaning solvent are detected as an impurity.

EXAMPLE 5

As a substrate, a silicon wafer or a glass substrate having an ITO transparent electrode is used. An alignment film material for a TFT liquid crystal device made of a polyimide solution, which has been imidized in advance, is coated onto the substrate by spin coating. The resultant membrane is baked in an oven at 180° C. for one hour to form a liquid crystal alignment film. After a rubbing treatment, a liquid crystal cell with a cell gap of about 10 μm is manufactured. A liquid crystal material in which 4-dimethylamino-4'-nitrobiphenyl is mixed as a field responsive impurity at a molar ratio of 1000:1 with respect to 5CB is injected into this liquid crystal cell.

A field response curve is measured using this liquid crystal cell and the evaluation apparatus in FIG. 1 in the same manner as described above while a pulse width T of an AC pulsed electric field is sequentially decreased into halves as follows:

T=1 ms, T=0.5 ms, T=0.25 ms, . . .

As a result, in the range in which the pulse width T is more than 31.25 μs, the slope of the field response curve changes upon polarity reversal of the AC pulsed electric field, and a discontinuity of the differential coefficient of the field response curve is observed. In contrast to this, in the range in which the pulse width T is 31.25 μs or less, even when the polarity of the AC pulsed electric field is reversed, the differential coefficient of the field response curve is continuous. As described above, it is confirmed that in the range in which the pulse width T is more than 31.25 μs, the 4-dimethylamino-4'-nitrobiphenyl mixed in the liquid crystal is detected as an impurity.

EXAMPLES 6, 7, AND 8

Field response curves are measured in the same manner as in Examples 3, 4, and 5 except that the evaluation apparatus in FIG. 2 is used instead of the evaluation apparatus in FIG. 1.

When the evaluation apparatus in FIG. 1 is used as in Examples 3 to 5, the temperature of a liquid crystal rises by about 5° C. For this reason, when measurement is repeated, variations in field response curves are observed.

More specifically, the magnitude of the field response is decreased with the temperature increase of the liquid crystal cell since the degree of alignment of the liquid crystal molecules in the cell is deteriorated. On the other hand, the magnitude of the field response is decreased when an impurity is mixed in the liquid crystal. Thus, there is a fear of confusing the change in field response curve due to the temperature change with that due to the mixed impurity. In order to avoid this, it needs to wait for about one hour until the temperature of the cell becomes stable, which does not agree with requirement of measuring many samples in a short time. Alternatively, it is important to prevent the temperature increase of the sample in order to solve the above problem.

In contrast to this, when the evaluation apparatus in FIG. 2 is used, the temperature increase of the liquid crystal cell is 1° C. or less. Even when measurements are repeated, no variations in field response curves are observed. Therefore, it is confirmed that the above problem relating to the temperature increase can be avoided to attain a high performance measurement.

Figure 7:
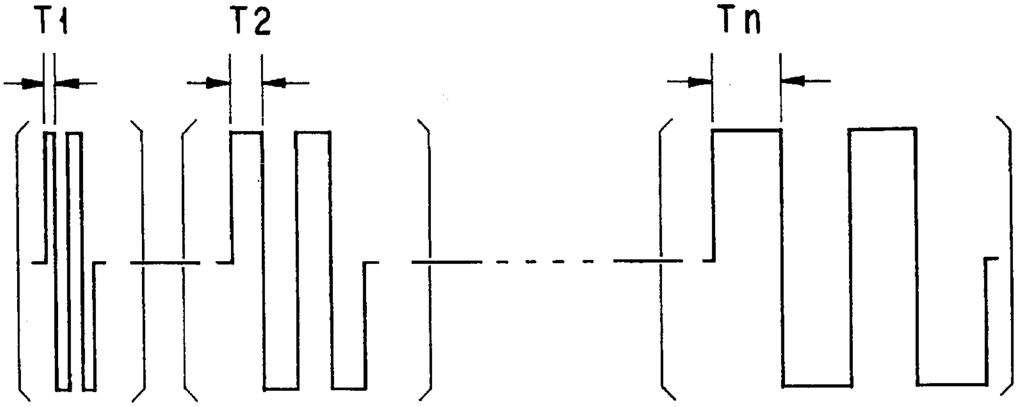
FIG. 7 is a timing chart showing the waveforms of pulse sequences having different pulse widths, which constitute a combined AC pulsed electric field in other examples of the present invention.
Figure 8:
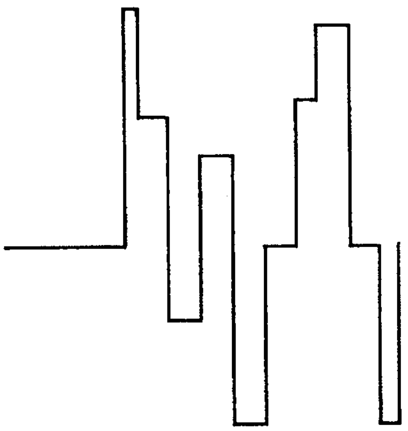
FIG. 8 is a timing chart showing a combined AC pulsed electric field in other examples of the present invention.
Figure 9:
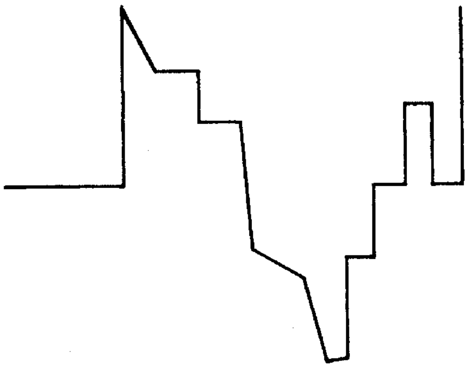
FIG. 9 is a timing chart showing another combined AC pulsed electric field in other examples of the present invention.

According to the findings obtained in the above examples, specific impurities mixed in a liquid crystal device can be detected by applying a combined AC pulsed electric field obtained by combining pulse sequences having different pulse widths. FIG. 7 shows the waveforms of pulse sequences having different pulse widths, which constitute a combined AC pulsed electric field used in such a method. FIGS. 8 and 9 respectively show combined AC pulsed electric fields. That is, each of impurities such as unreacted polyamic acid, ethanol, and 4-dimethylamino-4'-nitrobiphenyl which are mixed in a liquid crystal device can be detected and determined by properly setting the pulse widths of pulse sequences to be larger or lower than the thresholds confirmed in the respective examples.

What is claimed is:

1. A liquid crystal device evaluation method comprising the steps of:

irradiating a liquid crystal device having a liquid crystal layer between a pair of electrodes with light while applying an electric field to the liquid crystal device, and obtaining a field response curve corresponding to a change in light intensity with time by measuring light intensity having passed through the liquid crystal layer as a function of time;

wherein an impurity mixed in the liquid crystal device is detected on the basis of a slope of the field response curve which is obtained, when pulsed electric fields having different polarities are applied to the liquid crystal device, within a time corresponding to a pulse width of each pulsed electric field.

2. The method according to claim 1, wherein an AC pulsed electric field whose polarities are alternately reversed is applied to the liquid crystal device.

3. The method according to claim 2, wherein an impurity mixed in the liquid crystal device is identified by changing the pulse width of the AC pulsed electric field.

4. The method according to claim 3, wherein impurities mixed in the liquid crystal device are identified by applying the combined AC pulsed electric field obtained by combining the plurality of pulse sequences having different pulse widths.

5. The method according to claim 1, wherein the light is infrared light.

6. The method according to claim 5, wherein a field response curve corresponding to the change in light intensity with time is obtained on the basis of infrared absorption in the liquid crystal layer.

7. The method according to claim 1, wherein said field response curve is obtained while an electric field is applied to the liquid crystal device.

8. The method according to claim 1, wherein said slope of the field response curve changes depending on the impurities mixed in a liquid crystal device.

9. A liquid crystal device evaluation apparatus comprising:

means for applying an AC pulsed electric field whose polarity is reversed with time to a liquid crystal device having a liquid crystal layer between a pair of electrodes;

a light source for irradiating said liquid crystal layer with light;

a spectrometer for extracting light in a specific wavelength range from the light irradiated from said light source;

a photodetector for converting said light in the specific wavelength range, which has been irradiated from said light source and passed through said liquid crystal layer, into an electric signal;

means for analyzing the electric signal obtained by said photodetector as a function of time, and extracting a signal obtained by integrating the analyzed signals; and signal analyzing means for calculating a slope of a field response curve representing a change in the obtained integrated signal with time.

10. The apparatus according to claim 9, comprising a spectrometer disposed between said light source and said liquid crystal device, and adapted to disperse light from said light source to extract light in a specific wavelength range.

11. The apparatus according to claim 9, comprising a spectrometer disposed between said liquid crystal device and said photodetector, and adapted to disperse light having passed through the liquid crystal layer to extract light in a specific wavelength range.

12. The apparatus according to claim 9, wherein said means for applying an AC pulsed electric field applies a combined AC pulsed electric field obtained by combining pulse sequences having different pulse widths, and said analyzing and extracting means analyzes the electric signal obtained by said photodetector by discriminating electric signal component corresponding to the respective pulse sequence from the obtained electric signal, and extracts a signal obtained by analyzing as a function of time and integrating each of the obtained electric signal components.

13. The apparatus according to claim 9, further comprising amplification means for amplifying said electric signal.

14. The apparatus according to claim 9, wherein said light source is an infrared light source.

15. The apparatus according to claim 14, wherein said photodetector is an MCT detector.

16. The apparatus according to claim 15, wherein said means for analyzing a signal is one of a boxcar integrator and a digital oscilloscope.

17. A liquid crystal device evaluation apparatus comprising:

a power supply for applying an AC pulsed electric field whose polarity is reversed with time to a liquid crystal device having a liquid crystal layer between a pair of electrodes; and an infrared spectrometer for obtaining a field response curve of the liquid crystal device, to which the AC pulsed electric field is applied, by a time-resolved infrared spectroscopic method;

wherein said infrared spectrometer has a signal analyzer for calculating a slope of said field response curve.

18. The apparatus according to claim 15, wherein said infrared spectrometer comprises:

an infrared light source;

a spectrometer for extracting infrared light in a specific wavelength range from infrared light irradiated from said infrared light source;

an infrared detector for converting said infrared light in the specific wavelength range, which has been irradiated from said infrared light source and passed through the liquid crystal layer, into an electric signal;

means for analyzing the electric signal obtained by said infrared detector as a function of time, and extracting a signal obtained by integrating the analyzed signals; and signal analyzer for calculating a slope of a field response curve representing a change in the obtained integrated signal with time.

19. The apparatus according to claim 18, wherein said power supply for applying an AC pulsed electric field applies a combining AC pulsed electric field obtained by combining pulse sequences having different pulse widths, and said means for analyzing analyzes the electric signal obtained by said infrared detector by discriminating electric signal component corresponding to the respective pulse sequence from the obtained electric signal, and extracts a signal obtained by analyzing as the function of time and integrating each of the obtained electric signal components.

20. The apparatus according to claim 18, wherein said infrared detector is an MCT detector.

21. The apparatus according to claim 17, wherein said infrared spectrometer comprises an amplifier for amplifying the electric signal.

22. The apparatus according to claim 20, wherein said means for analyzing is one of a boxcar integrator and a digital oscilloscope.

23. The method according to claim 17, wherein said field response curve is obtained while an electric field is applied to the liquid crystal device.

24. The method according to claim 17, wherein said slope of the field response curve changes depending on the impurities mixed in the liquid crystal device.

* * * * *